(12) United States Patent
Shim

(10) Patent No.: US 9,870,837 B1
(45) Date of Patent: *Jan. 16, 2018

(54) SEMICONDUCTOR MEMORY DEVICE FOR PERFORMING A POST PACKAGE REPAIR OPERATION AND OPERATING METHOD THEREOF

(71) Applicant: SK hynix Inc., Gyeonggi-do (KR)

(72) Inventor: Young-Bo Shim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/426,399

(22) Filed: Feb. 7, 2017

(30) Foreign Application Priority Data

Jul. 18, 2016 (KR) ........................ 10-2016-0090840

(51) Int. Cl.
*G11C 17/00* (2006.01)
*G11C 29/00* (2006.01)
*G11C 17/16* (2006.01)
*G11C 17/18* (2006.01)

(52) U.S. Cl.
CPC ............ *G11C 29/787* (2013.01); *G11C 17/16* (2013.01); *G11C 17/18* (2013.01)

(58) Field of Classification Search
CPC ......... G11C 17/16; G11C 17/18; G11C 29/78; G11C 29/76; G11C 29/787
USPC ................................ 365/96, 200, 201, 225.7
See application file for complete search history.

(56) References Cited

U.S. PATENT DOCUMENTS 7,486,577 B2   2/2009  Kim et al.
9,064,588 B1 *  6/2015  Kwon .................... G11C 17/16
9,508,456 B1 * 11/2016  Shim ...................... G11C 29/78

* cited by examiner

*Primary Examiner* — David Lam
(74) *Attorney, Agent, or Firm* — IP & T Group LLP

(57) ABSTRACT

A semiconductor memory device includes a fuse array circuit including a row fuse region and a column fuse region, and suitable for outputting fuse information from row fuse sets and from column fuse sets and outputting programmed row and column addresses as row and column fall data, during a boot-up operation; a fuse array control circuit suitable for storing a fail address based on a fail cell information during a repair operation, searching unused fuse sets from the row fuse region and the column fuse region based on the fuse information during the boot-up operation, and controlling the fail address to be programmed in the unused fuse sets during a rupture operation; and a row and column redundancy circuit suitable for performing a row or column redundancy operation in correspondence to the row and column fail data.

22 Claims, 11 Drawing Sheets

SEMICONDUCTOR MEMORY DEVICE FOR PERFORMING A POST PACKAGE REPAIR OPERATION AND OPERATING METHOD THEREOF

CROSS-REFERENCE TO RELATED APPLICATION

This application claims priority under 35 U.S.C. §119 to Korean Patent Application No. 10-2016-0090840 filed on Jul. 18, 2016 in the Korean Intellectual Property Office, the disclosure of which is incorporated herein by reference in its entirety.

TECHNICAL FIELD

Exemplary embodiments relate to a semiconductor design technology, and more particularly, to a semiconductor memory device capable of performing a post package repair operation and an operating method thereof.

DISCUSSION OF THE RELATED ART

In general, in a semiconductor memory device such as a dynamic random access memory (DRAM), after design and fabrication, the pass or fail of a chip is determined through a test at a wafer level (hereinafter, referred to as a 'wafer test') and a test after packaging (hereinafter, referred to as a 'post package test').

Typically, when a few or even just one among a number of memory cells which are tested in a semiconductor memory device fail, the semiconductor memory device cannot perform properly and is considered a defective product which should be discarded. Discarding a semiconductor memory device as a defective product in the case where only a small number of memory cells fall, is inefficient and decreases the yield.

To mitigate this, currently, a method is used, in which redundancy memory cells are provided in a semiconductor memory device and when the failed memory cells can be identified and replaced with redundancy memory cells through a wafer test process and a post package test process the semiconductor memory device is handled as a good product. The operation of replacing failed memory cells with redundancy memory cells through the post package test process is referred to as post package repair. The yield of a semiconductor memory device may be improved substantially with the use of a post package repair.

According to existing post package repair methods, only row repair is supported. Therefore, in the case where a column-oriented fail occurs, repair is impossible and thus the yield may decrease. Hence, a post package repair scheme capable of supporting both row repair and column repair is demanded in the art.

SUMMARY

Various embodiments are directed to a semiconductor memory device capable of supporting both row repair and column repair depending on the type of a fail when performing post package repair, and an operating method thereof.

In an embodiment, a semiconductor memory device may include: a fuse array circuit including a row fuse region which includes a plurality of row fuse sets each for programming a row address of a fail cell and a column fuse region which includes a plurality of column fuse sets each for programming a column address of a fail cell, the fuse array circuit being suitable for outputting fuse information from the row fuse sets and from the column fuse sets and outputting a row address as a row fail data and a column address as a column fail data, during a boot-up operation; a fuse array control circuit suitable for storing a fail address based on fail cell information during a repair operation, searching unused fuse sets from the row fuse region and the column fuse region based on the fuse information during the boot-up operation, and controlling the fail address to be programmed in the unused fuse sets during a rupture operation; and a row and column redundancy circuit suitable for performing a row redundancy or column redundancy operation in correspondence to the row fail data and the column fall data.

In an embodiment, a semiconductor memory device may include: a fuse array circuit including a row fuse region which includes a plurality of row fuse sets, each for programming a row address of a fail cell, and a column fuse region which includes a plurality of column fuse sets, each for programming a column address of the fail cell; an address latch block suitable for storing a fail address including a row address, a column address, a bank address and mat information in response to a repair mode signal; a control signal generation block suitable for generating a boot-up signal and a rupture signal in response to an active signal and a write signal, in response to the repair mode signal; a fall region search unit suitable for searching the row fuse region and the column fuse region corresponding to the fail address and generating a row region signal and a plurality of column region signals, in response to a counting signal which is generated by counting a clock signal, when the boot-up signal is enabled; a fuse set latch unit suitable for storing unused row fuse information and unused column fuse information based on the row region signal, the plurality of column region signals and fuse information outputted from the fuse array circuit, and selectively outputting the stored unused row or column fuse information in response to an up and down mat signal and a row and column select signal; and a rupture control block suitable for controlling the fall address to be programmed in a row fuse set or a column fuse set corresponding to the unused row or column fuse information, in response to the rupture signal.

In an embodiment, a method for operating a semiconductor memory device including a fuse array circuit including a row fuse region which includes a plurality of row fuse sets, each for programming a row address of a fall cell and a column fuse region which includes a plurality of column fuse sets, each for programming a column address of a fail address, storing a fail address based on fail cell information in a post package repair mode; performing a first boot-up operation to search unused fuse sets of the row fuse region and the column fuse region based on fuse information outputted from the fuse array circuit; performing a rupture operation to program the fall address in the unused fuse sets; performing a second boot-up operation to output fail data programmed in the fuse array circuit; and performing a row redundancy or column redundancy operation in correspondence to the fail data.

The storing of the fall address may comprise: storing the fail address including a row address, a column address, a bank address and mat information of a fail cell in response to an active signal and a write signal, in the post package repair mode.

The performing of the first boot-up operation may comprise: generating a boot-up signal and a rupture signal in response to the active signal and the write signal in the post package repair mode; searching the row fuse region and the column fuse region corresponding to the fail address, in response to the boot-up signal; and storing unused fuse information of the row fuse region and the column fuse region searched based on the fuse information.

The searching of the row fuse region and the column fuse region corresponding to the fall address, in response to the boot-up signal, may comprise: counting a clock signal to generate a counting signal, when the boot-up signal is enabled; searching the row fuse region corresponding to the fail address to output a row region signal, in response to the counting signal; generating up mat information by up-counting the mat information of the fail address, and down mat information by down-counting the mat information; searching the column fuse region corresponding to the bank address and the mat information of the fall address and outputting a first column region signal, in response to the counting signal; searching the column fuse region corresponding to the bank address and the up mat information and outputting a second column region signal, in response to the counting signal; and searching the column fuse region corresponding to the bank address and the down mat information and outputting a third column region signal, in response to the counting signal.

After the performing of the first boot-up operation, the method may further comprise: controlling the rupture operation not to be performed, when unused fuse sets of the row fuse region and the column fuse region searched based on the fuse information do not exist.

The performing of the rupture operation may comprise: outputting an unused fuse information in response to an up and down mat signal and a row and column select signal; receiving the fail address and generating a repair address corresponding to the row and column select signal; and programming the repair address in a row fuse set or a column fuse set corresponding to the unused fuse information, in response to the rupture signal.

After the performing of the second boot-up operation, the method may further comprise: reading the stored unused fuse information through a data input/output (DQ) pad by applying a mode register (MRS) command.

BRIEF DESCRIPTION OF THE DRAWINGS

These and other features and advantages of the present invention will become apparent from the following detailed description in reference to the accompanying drawings in which.

DETAILED DESCRIPTION

Figure 1:
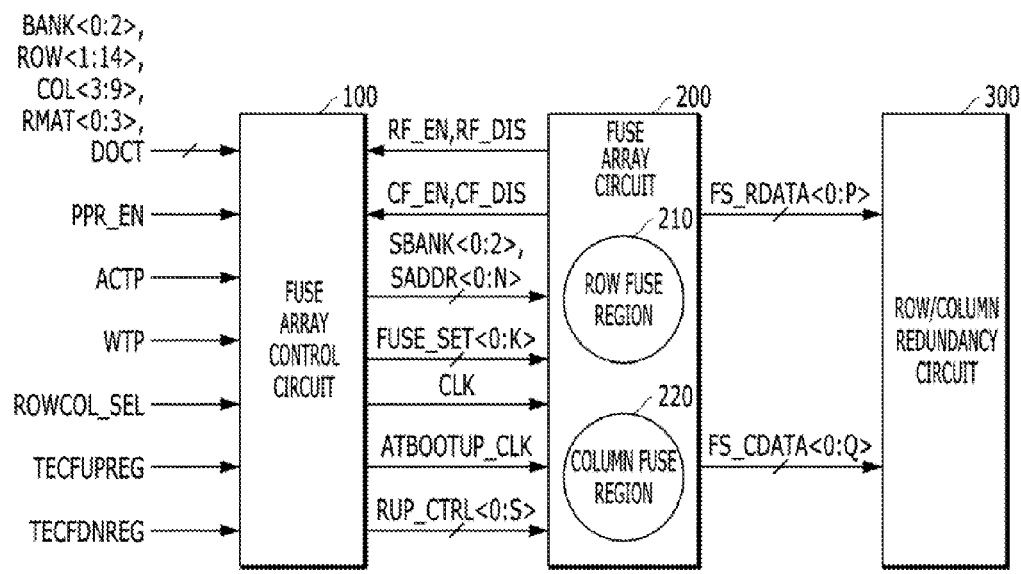
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

For the sake of convenience in explanation, illustration of components related with a normal operation is omitted in the drawings, and descriptions will be made mainly for components related with a post package repair operation.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Referring now to FIG. 1, a semiconductor memory device is provided, in accordance with an embodiment of the present invention.

Accordingly, the semiconductor memory device of FIG. 1, may include a fuse array control circuit 100, a fuse array circuit 200, and a row/column redundancy circuit 300.

The fuse array circuit 200 may include a row fuse region 210 which includes a plurality of row fuse sets (not shown) for programming the row addresses of fail cells and a column fuse region 220 which includes a plurality of column fuse sets (not shown) for programming the column addresses of fail cells. The fuse array circuit 200 may output row fuse information RF_EN, RF_DIS, and column fuse information CF_EN, CF_DIS to the fuse array control circuit 100 and output programmed row address and column address as row fail data FS_RDATA<0:P> and column fail data FS_C-

DATA<0:Q> to the row/column redundancy circuit 300, in a boot-up operation. The fuse information RF_EN, RF_DIS, CF_EN and CF_DIS include first information RF_EN on whether a corresponding row fuse set is already used, second information RF_DIS on whether the corresponding row fuse set is impossible to use, third information CF_EN on whether a corresponding column fuse set is already used, and fourth information CF_DIS on whether the corresponding column fuse set is impossible to use. For reference, the corresponding row or column fuse set which is impossible to use means that the corresponding row or column fuse set is not properly ruptured or does not output information therein due to a defect or fail such as a bad connection.

The fuse array control circuit 100 may store a fail address based on fail cell information in a post package repair mode, search unused fuse sets of the row fuse region 210 and the column fuse region 220 based on the fuse information RF_EN, RF_DIS, CF_EN and CF_DIS outputted from the fuse array circuit 200 in the boot-up operation, and control the fail address to be programmed in the unused fuse sets, in a rupture operation. The fuse array control circuit 100 may store the unused fuse sets searched in the boot-up operation, as unused row fuse information of the row fuse region 210 and unused column fuse information of the column fuse region 220, and control a fail address to be programmed in the unused fuse sets by selecting and outputting one of the unused row fuse information and the unused column fuse information according to a row/column select signal ROW-COL_SEL, in the rupture operation. When there exists no unused fuse set in the row fuse region 210 and the column fuse region 220 which are searched based on the fuse informations RF_EN, RF_DIS, CF_EN and CF_DIS, the fuse array control circuit 100 does not perform the rupture operation.

The row/column redundancy circuit 300 may perform row repair or column repair in correspondence to the row fail data FS_RDATA<0:P> or the column fail data FS_CDATA<0:Q> outputted from the fuse array circuit 200.

The fuse array control circuit 100 may enter a post package repair (PPR) mode in response to a PPR mode signal PPR_EN. The fuse array control circuit 100 may receive a row address information ROW<1:14>, a column address information COL<3:9>, a bank information BANK<0:2>, a mat information RMAT<0:3> and a mat region information DOCT in response to an active signal ACTP and a write signal WTP, and generate a bank address SBANK<0:2> and a repair address SADDR<0:N>. The PPR mode signal PPR_EN may be enabled by a mode register (MRS) in the PPR mode. The active signal ACTP may be a pulse signal which is enabled for a predetermined period when an active command is inputted. The write signal WTP may be a pulse signal which is enabled for a predetermined period when a write command is inputted. The bank information BANK<0:2> may represent a bank where a fall cell detected in a post package test is positioned, among a plurality of banks (for example, eight banks). The row address information ROW<1:14> may represent the row address of a fall cell. The column address information COL<3:9> may represent the column address of a fail cell. The mat information RMAT<0:3> may be the address signal of a mat where a fail cell is positioned, among a plurality of cell mats. The mat region information DOCT may be a signal for identifying a column fuse region allocated to each cell mat.

Further, the fuse array control circuit 100 may generate an Internal boot-up signal ATBOOTUP_EN (not shown in FIG. 1 but shown in FIG. 2) and an internal rupture signal ATRUP_EN (not shown in FIG. 1 but shown in FIG. 2) in response to the active signal ACTP and the write signal WTP. The fuse array control circuit 100 may search an unused fuse set based on the fuse information RF_EN, RF_DIS, CF_EN and CF_DIS and store an unused fuse information FUSE_<0:K>, in response to the internal boot-up signal ATBOOTUP_EN. The fuse array control circuit 100 may generate a rupture control signal RUP_CTRL<0:S> for controlling the repair address SADDR<0:N> to be programmed in an unused fuse set corresponding to the unused fuse information FUSE_<0:K>, in response to the internal rupture signal ATRUP_EN.

The fuse array control circuit 100 may generate a row select signal ROW_SEL (not shown in FIG. 1 but shown in FIG. 7) and first to third column select signals COL_SEL, COL_UPSEL and COL_DNSEL (not shown in FIG. 1 but shown in FIG. 7) by combining the row/column select signal ROWCOL_SEL, an up mat signal TECFUPREG and a down mat signal TECFDNREG. The fuse array control circuit 100 may output the unused fuse information FUSE_<0:K> by selecting one of the unused row fuse information of the row fuse region 210 and the unused column fuse information of the column fuse region 220, in response to the row select signal ROW_SEL and the first to third column select signals COL_SEL, COL_UPSEL and COL_DNSEL. The row/column select signal ROWCOL_SEL may select one of a row repair and a column repair in the PPR mode. The up mat signal TECFUPREG may represent an up mat sharing a bit line sense amplifier (BLSA) with a mat where a fail cell is positioned. The down mat signal TECFDNREG may represent a down mat sharing the bit line sense amplifier (BLSA) with the mat where the fall cell is positioned.

In the case where a row repair is performed, repair is performed only in a corresponding row of a mat where a fail cell is positioned. In the case where a column repair is performed, repair is performed not only in a mat where a fall cell is positioned but also an up mat and a down mat which share a bit line sense amplifier (BLSA) with the mat where the fail cell is positioned. To this end, the fuse array control circuit 100 may receive the up mat signal TECFUPREG and the down mat signal TECFDNREG together with the row/column select signal ROWCOL_SEL, and control, in the case of a column repair, repair to be performed also in corresponding columns of the up mat and the down mat which share the bit line sense amplifier (BLSA) with the mat where the fail cell is positioned.

Further, the fuse array control circuit 100 may provide, to the fuse array circuit 200, a clock signal CLK which toggles when the internal boot-up signal ATBOOTUP_EN or the internal rupture signal ATRUP_EN is enabled and a boot-up clock signal ATBOOTUP_CLK which toggles when the Internal boot-up signal ATBOOTUP_EN is enabled. The fuse array circuit 200 may output the fuse information RF_EN, RF_DIS, CF_EN and CF_DIS of a row fuse set and a column fuse set and output programmed row address and column address as the row fail data FS_RDATA<0:P> and the column fail data FS_CDATA<0:Q>, in synchronization with the clock signal CLK and the boot-up clock signal ATBOOTUP_CLK.

As described above, in accordance with an embodiment of the present invention, a semiconductor memory device is provided that can perform a post package repair that includes performing a row repair for a row fail and a column repair for a column fail. Accordingly, the yield of the semiconductor memory device may be significantly improved.

Hereinafter, the respective components of the fuse array control circuit 100 will be described in more detail with reference to FIG. 2.

Figure 2:
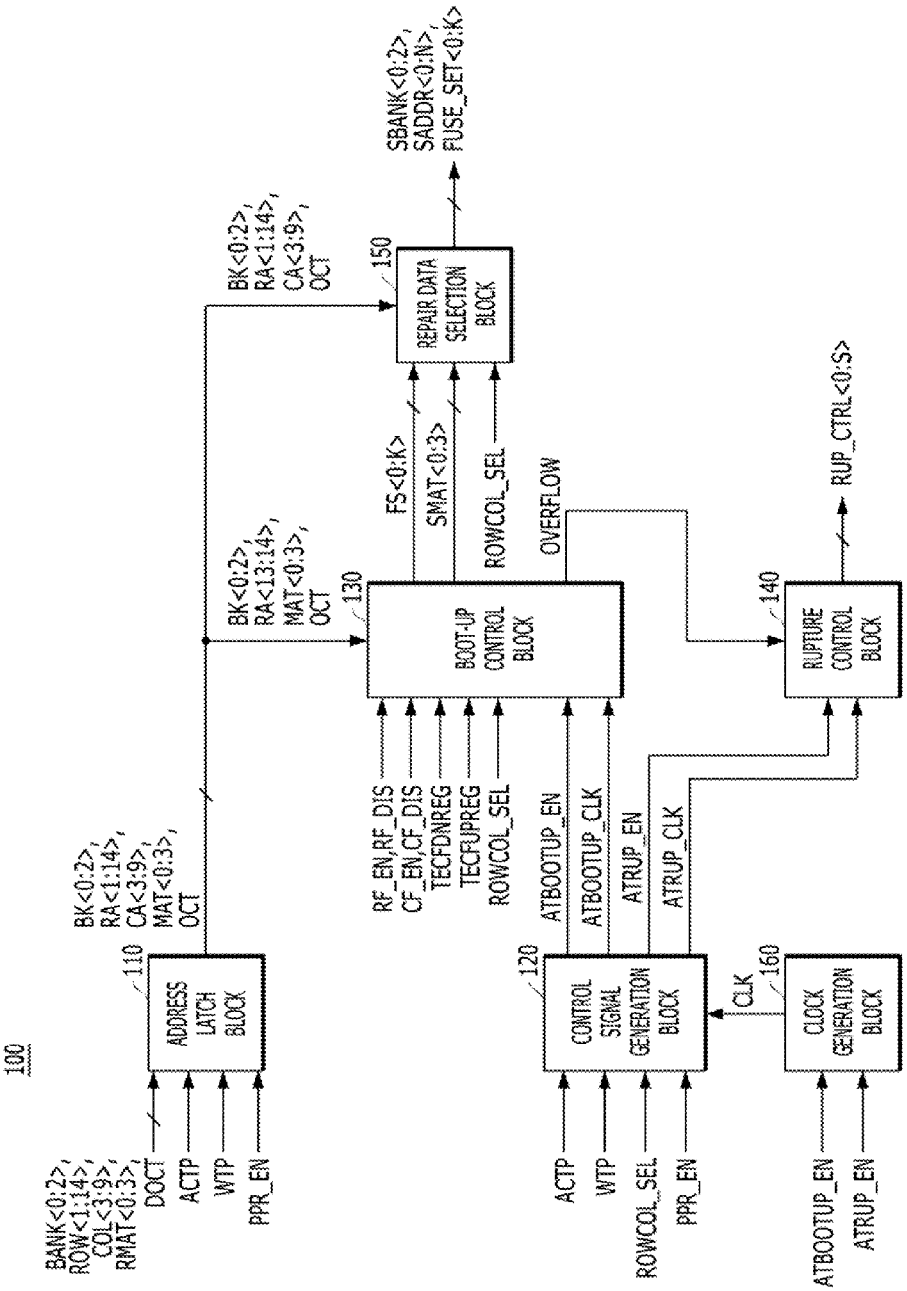
FIG. 2 is a block diagram illustrating an example configuration for a fuse array control circuit employed in the semiconductor memory device of FIG. 1.

FIG. 2 is a block diagram illustrating an example configuration for the fuse array control circuit 100 shown in FIG. 1.

Referring to FIG. 2, the fuse array control circuit 100 may include an address latch block 110, a control signal generation block 120, a boot-up control block 130, a rupture control block 140, and a repair data selection block 150.

The address latch block 110 may store a fail address, based on the row address information ROW<1:14>, the column address information COL<3:9>, the bank information BANK<0:2>, the mat information RMAT<0:3> and the mat region information DOCT of a fail cell, in response to the active signal ACTP and the write signal WTP, when the PPR mode signal PPR_EN is enabled. At this time, the fail address may include a row address RA<1:14>, a column address CA<3:9>, a bank address BK<0:2>, a mat address MAT<0:3> and a mat region signal OCT. In the case where row repair is to be performed in the PPR mode, the active signal ACTP is inputted to the address latch block 110 together with the bank information BANK<0:2> and the row address information ROW<1:14>. According to this fact, the address latch block 110 may store the row address information ROW<1:14> and the bank information BANK<0:2> as the row address RA<1:14> and the bank address BK<0:2>, respectively. Conversely, in the case where column repair is to be performed in the PPR mode, after the active signal ACTP is inputted to the address latch block 110 together with the bank information BANK<0:2> and the row address information ROW<1:14>, the write signal WTP is inputted to the address latch block 110 together with the column address information COL<3:9>, the mat information RMAT<0:3> and the mat region information DOCT. According to this fact, the address latch block 110 may store the row address information ROW<1:14> and the bank information BANK<0:2> as the row address RA<1:14> and the bank address BK<0:2>, respectively, and store the column address information COL<3:9>, the mat information RMAT<0:3> and the mat region information DOCT as the column address CA<3:9>, the mat address MAT<0:3> and the mat region signal OCT, respectively.

The control signal generation block 120 may sequentially generate the internal boot-up signal ATBOOTUP_EN and the internal rupture signal ATRUP_EN in response to the row/column select signal ROWCOL_SEL, the active signal ACTP and the write signal WTP, when the PPR mode signal PPR_EN is enabled. Moreover, the control signal generation block 120 may receive the clock signal CLK, and additionally generate the boot-up clock signal ATBOOTUP_CLK which toggles during the enable period of the internal boot-up signal ATBOOTUP_EN and a rupture clock signal ATRUP_CLK which toggles during the enable period of the internal rupture signal ATRUP_EN.

The fuse array control circuit 100 may further include a clock generation block 160 which generates the clock signal CLK in response to the internal boot-up signal ATBOOTUP_EN and the internal rupture signal ATRUP_EN. The clock generation unit 160 may generate the clock signal CLK which toggles when the internal boot-up signal ATBOOTUP_EN or the internal rupture signal ATRUP_EN is enabled.

The boot-up control block 130 may search the row fuse region 210 and the column fuse region 220 corresponding to a fail address in response to the internal boot-up signal ATBOOTUP_EN and the boot-up clock signal ATBOOTUP_CLK, and then, store the unused row fuse information of the row fuse region 210 and the unused column fuse information of the column fuse region 220 searched, based on the fuse information RF_EN, RF_DIS, CF_EN and CF_DIS. The boot-up control block 130 may output an unused fuse information FS<0:K> by selecting one of the unused row fuse information or the unused column fuse information corresponding to the row/column select signal ROWCOL_SEL. For reference, the fail address may include partial bits RA<13:14> of the row address RA<1:14>, the bank address BK<0:2>, the mat address MAT<0:3> and the mat region signal OCT. The partial bits RA<13:14> of the row address RA<1:14> may include not row address information but mat group information which is obtained by grouping the plurality of cell mats into a predetermined number. Hereinafter, the partial bits RA<13:14> of the row address RA<1:14> will be referred to as a mat group signal RA<13:14>.

Figure 7:
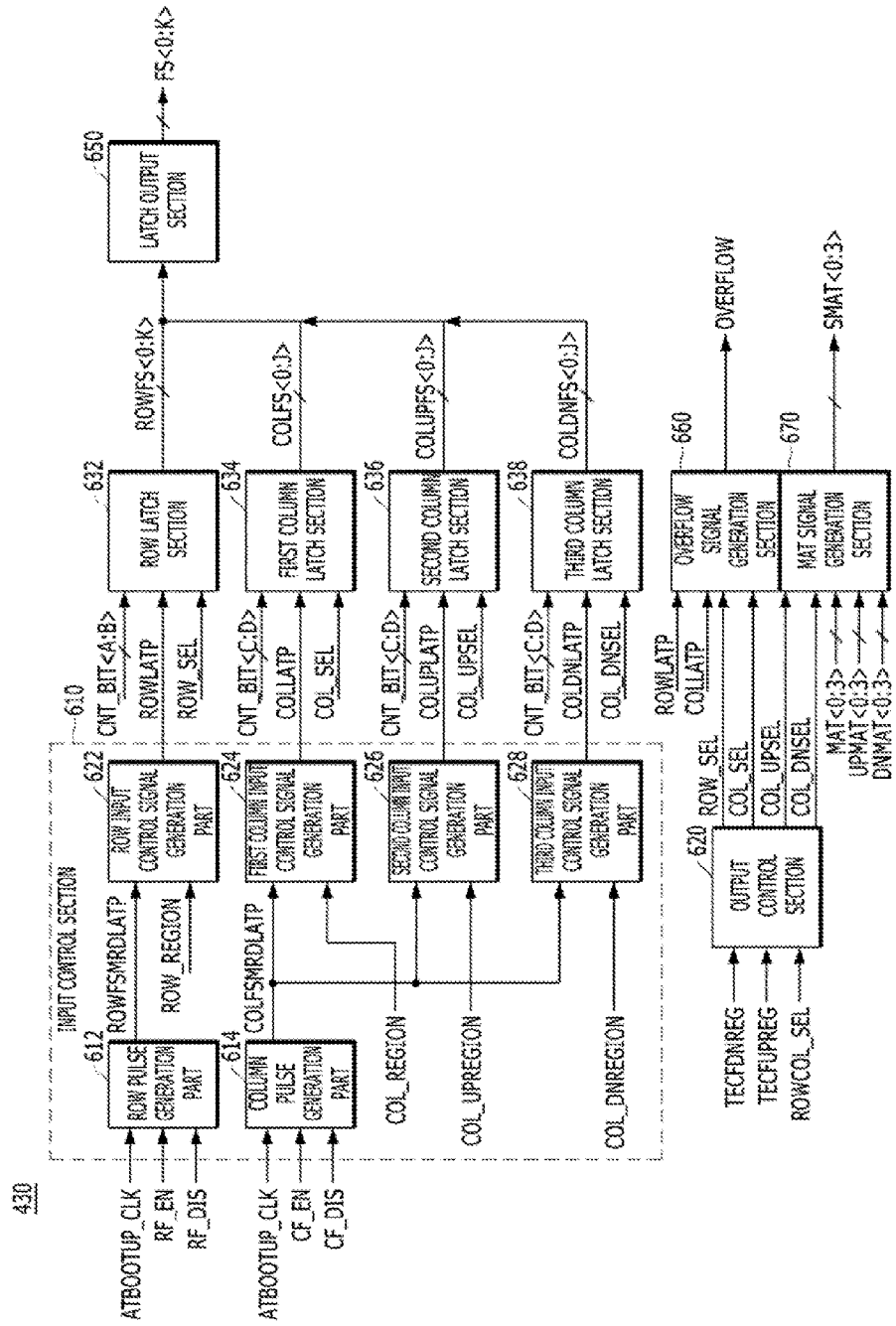
FIG. 7 is a block diagram illustrating an example configuration of a fuse set latch unit employed in the boot up control block of FIG. 5.

The boot-up control block 130 may receive the up mat signal TECFUPREG and the down mat signal TECFDNREG together with the row/column select signal ROWCOL_SEL, and generate the row select signal ROW_SEL (not shown in FIG. 2 but shown in FIG. 7) and the first to third column select signals COL_SEL, COL_UPSEL and COL_DNSEL (not shown in FIG. 2 but shown in FIG. 7). For example, if the row/column select signal ROWCOL_SEL indicating row pair is inputted, the boot-up control block 130 may output the unused row fuse information as the unused fuse information FS<0:K> in response to the row select signal ROW_SEL. Conversely, if the row/column select signal ROWCOL_SEL indicating column pair is inputted, the boot-up control block 130 may output the unused column fuse information as the unused fuse information FS<0:K> in response to the first to third column select signals COL_SEL, COL_UPSEL and COL_DNSEL. In addition, the boot-up control block 130 may receive the mat address MAT<0:3> of the fail address and generate an up mat address UPMAT<0:3> and a down mat address DNMAT<0:3> (shown in FIG. 5), and sequentially output a selected mat address SMAT<0:3> according to the first to third column select signals COL_SEL, COL_UPSEL and COL_DNSEL. Thus, in the case of column repair, the boot-up control block 130 may control repair to be performed also in corresponding columns of an up mat and a down mat which share a bit line sense amplifier (BLSA) with a mat where the fail cell is positioned.

The repair data selection block 150 may receive the selected mat address SMAT<0:3> and the fail address, and generate the repair address SADDR<0:N> corresponding to the row/column select signal ROWCOL_SEL. At this time, the fail address may include the row address RA<1:14>, the column address CA<3:9>, the bank address BK<0:2> and the mat region signal OCT. The repair data selection block 150 may output the bank address BK<0:2> as a selected bank address SBANK<0:2>, and output the unused fuse information FS<0:K> as an unused fuse information FUSE_<0:K>.

The boot-up control block 130 may generate an overflow signal OVERFLOW when the unused fuse information FS<0:K> does not exist. The rupture control block 140 may generate the rupture control signal RUP_CTRL<0:S> for controlling the repair address SADDR<0:N> to be programmed in an unused fuse set corresponding to the unused fuse information FUSE_<0:K>, in response to the internal rupture signal ATRUP_EN and the rupture clock signal ATRUP_CLK. The rupture control block 140 may disable and output the rupture control signal RUP_CTRL<0:S> in response to the overflow signal OVERFLOW.

Figure 3:
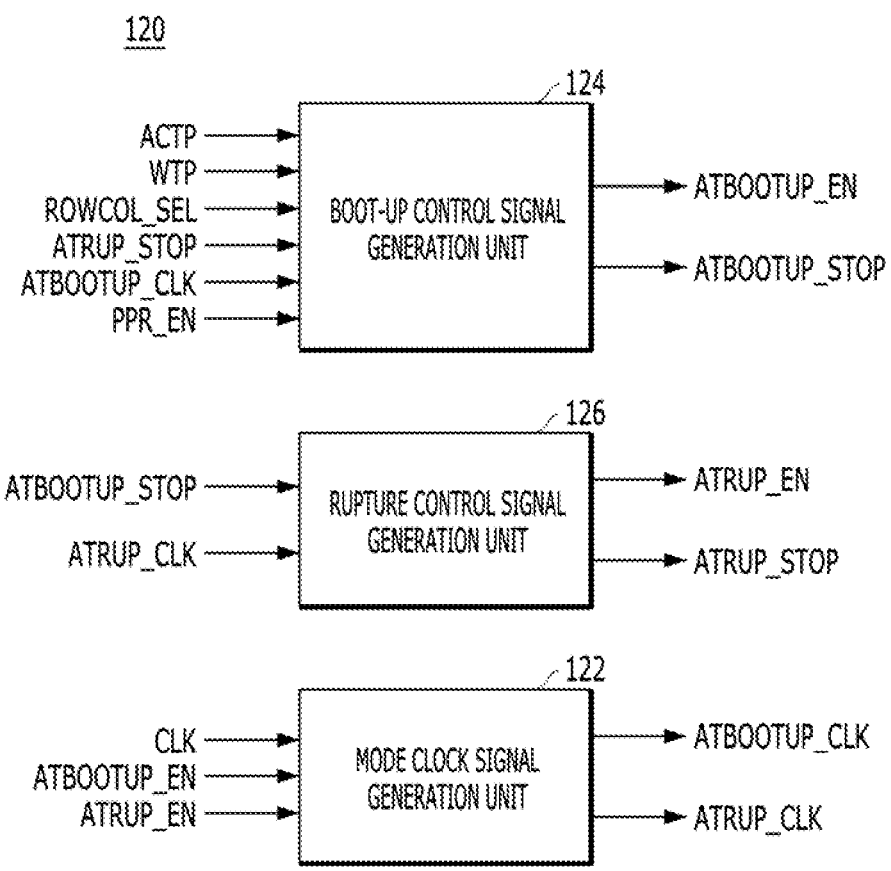
FIG. 3 is a block diagram illustrating an example configuration for a control signal generation block employed in the fuse array control circuit of FIG. 2.

FIG. 3 is a detailed block diagram illustrating an example configuration for the control signal generation block 120 shown in FIG. 2.

Referring to FIG. 3, the control signal generation block 120 may include a mode clock signal generation unit 122, a boot-up control signal generation unit 124, and a rupture control signal generation unit 126.

The mode clock signal generation unit 122 may receive the clock signal CLK, and generate the boot-up clock signal ATBOOTUP_CLK which toggles during the enable period of the internal boot-up signal ATBOOTUP_EN and the rupture clock signal ATRUP_CLK which toggles during the enable period of the internal rupture signal ATRUP_EN.

The boot-up control signal generation unit 124 may generate the Internal boot-up signal ATBOOTUP_EN which is enabled in response to the active signal ACTP or the write signal WTP or a rupture stop signal ATRUP_STOP and is disabled in response to a boot-up stop signal ATBOOT-UP_STOP, when the PPR mode signal PPR_EN is enabled. Furthermore, the boot-up control signal generation unit 124 may generate the boot-up stop signal ATBOOTUP_STOP after the boot-up clock signal ATBOOTUP_CLK toggles for a predetermined period.

The rupture control signal generation unit 126 may generate the internal rupture signal ATRUP_EN which is enabled in response to the boot-up stop signal ATBOOT-UP_STOP and is disabled in response to the rupture stop signal ATRUP_STOP. The rupture control signal generation unit 126 generates the rupture stop signal ATRUP_STOP after the rupture clock signal ATRUP_CLK toggles for a predetermined period.

Figure 4A:
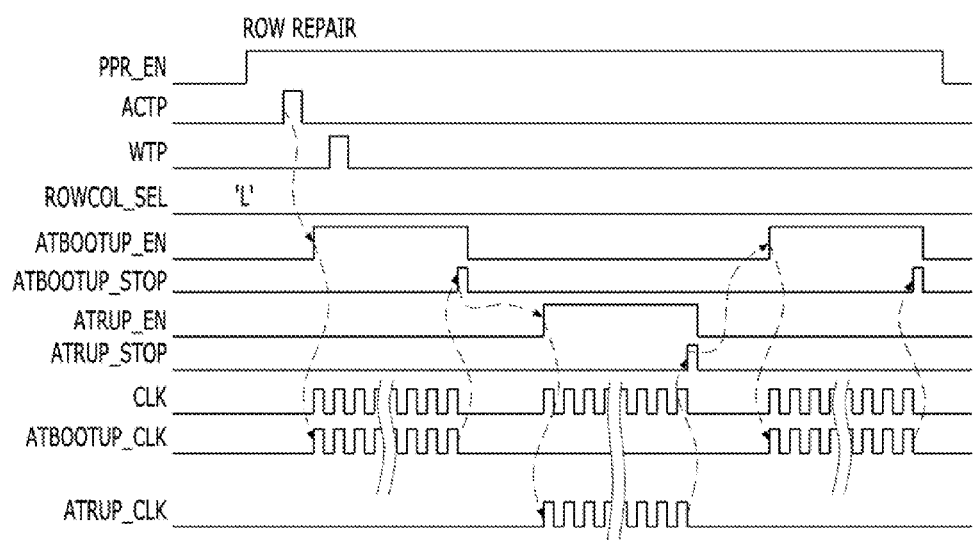
FIGS. 4A and 4B are waveform diagrams illustrating an operation of the control signal generation block shown in FIG. 3.
Figure 4B:
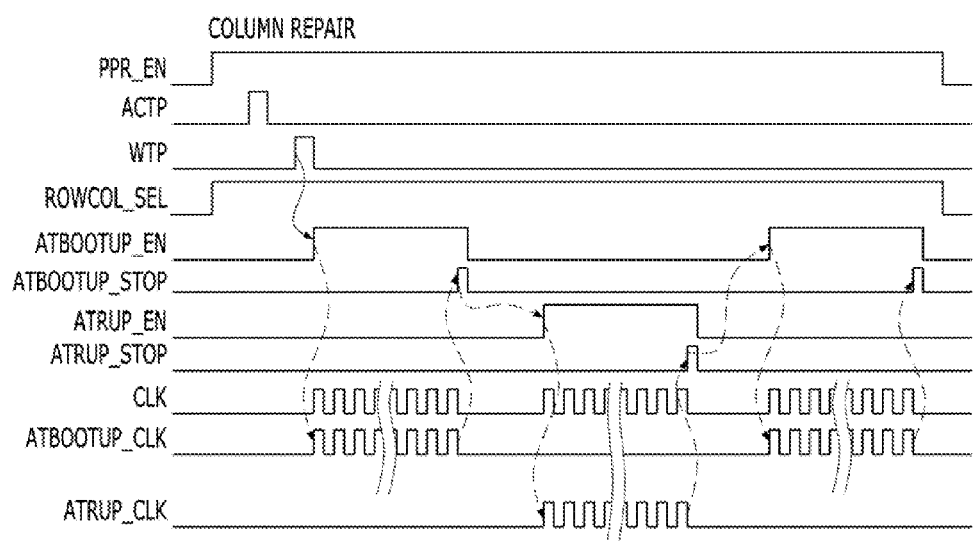

FIGS. 4A and 4B are waveform diagrams illustrating an operation of the control signal generation block 120 shown in FIG. 3. FIG. 4A shows the operation of the control signal generation block 120 in the case of a row repair, and FIG. 4B shows the operation of the control signal generation block 120 in the case of a column repair.

Referring to FIGS. 4A and 4B, the PPR mode is entered as the PPR mode signal PPR_EN is enabled. In FIG. 4A, the row/column select signal ROWCOL_SEL which has a low level indicating row repair, the internal boot-up signal ATBOOTUP_EN is enabled in response to the active signal ACTP. Conversely, in FIG. 4B, according to the row/column select signal ROWCOL_SEL which has a high level indicating column repair, the internal boot-up signal ATBOOTUP_EN is enabled in response to the write signal WTP.

When the internal boot-up signal ATBOOTUP_EN is enabled, after the boot-up clock signal ATBOOTUP_CLK toggles for the predetermined period, the boot-up stop signal ATBOOTUP_STOP is generated. Accordingly, the internal boot-up signal ATBOOTUP_EN is disabled, and the internal rupture signal ATRUP_EN is enabled.

When the internal rupture signal ATRUP_EN is enabled, after the rupture clock signal ATRUP_CLK toggles for the predetermined period, the rupture stop signal ATRUP_STOP is generated. Accordingly, the internal rupture signal ATRUP_EN is disabled, and the internal boot-up signal ATBOOTUP_EN is enabled again.

When the internal boot-up signal ATBOOTUP_EN is enabled, after the boot-up clock signal ATBOOTUP_CLK toggles for the predetermined period, the boot-up stop signal ATBOOTUP_STOP is generated. Accordingly, the Internal boot-up signal ATBOOTUP_EN is disabled. Thereafter, the PPR mode is exited as the PPR mode signal PPR_EN is disabled.

For reference, while not shown in a drawing, before the internal boot-up signal ATBOOTUP_EN or the internal rupture signal ATRUP_EN is enabled, a boot-up power enable signal provided to perform the boot-up operation or a rupture power enable signal provided to perform the rupture operation may be enabled in advance. Therefore, a power supply voltage necessary for the boot-up operation or the rupture operation may be supplied in advance.

Figure 5:
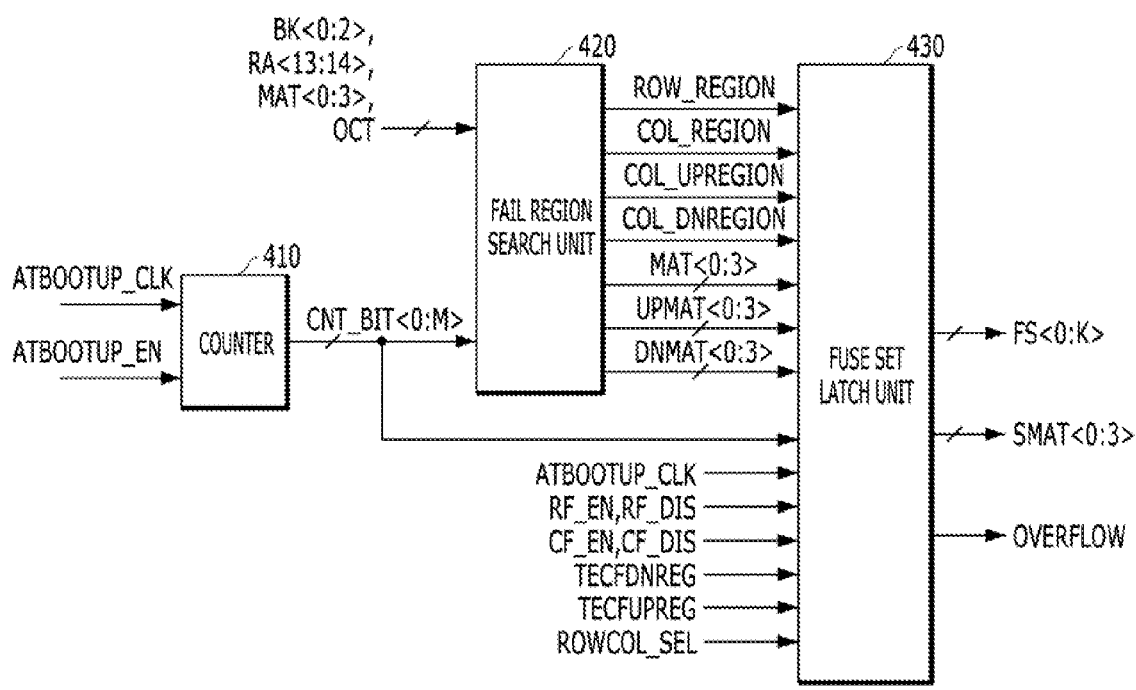
FIG. 5 is a block diagram illustrating an example configuration for a boot-up control block employed in the fuse array control circuit of FIG. 2.

FIG. 5 is a detailed block diagram illustrating an example configuration for the boot-up control block 130 shown in FIG. 2.

Referring to FIG. 5, the boot-up control block 130 may include a counter 410, a fall region search unit 420, and a fuse set latch unit 430.

The counter 410 may count the boot-up clock signal ATBOOTUP_CLK and generate a counting signal CNT_BIT<0:M> when the internal boot-up signal ATBOOTUP_EN is enabled. While FIG. 5 illustrates the case where the counter 410 performs a counting operation by receiving the boot-up clock signal ATBOOTUP_CLK, it is to be noted that, in another embodiment, the counter 410 may perform a counting operation by receiving the clock signal CLK.

The fail region search unit 420 may search the row fuse region 210 and the column fuse region 220 corresponding to the fall address, in response to the counting signal CNT_BIT<0:M>, and output a row region signal ROW_REGION and a plurality of column region signals COL_REGION, COL_UPREGION and COL_DNREGION. The fall region search unit 420 may receive the mat address MAT<0:3> of the fall address, and generate the up mat address UPMAT<0:3> and the down mat address DNMAT<0:3>. In the illustrated embodiment, in order to perform repair also in the corresponding columns of an up mat and a down mat which share a bit line sense amplifier (BLSA) with the mat where the fail cell is positioned, the plurality of column region signals COL_REGION, COL_UPREGION and COL_DN-REGION may include a first column region signal COL_REGION corresponding to the mat address MAT<0:3> of the fail address, a second column region signal COL_U-PREGION corresponding to the up mat address UPMAT<0:3>, and a third column region signal COL_DNREGION corresponding to the down mat address DNMAT<0:3>.

The fuse set latch unit 430 may store the counting signal CNT_BIT<0:M> as unused fuse information, based on the row region signal ROW_REGION, the plurality of column region signals COL_REGION, COL_UPREGION and COL_DNREGION and the fuse information RF_EN, RF_DIS, CF_EN and CF_DIS, and output the stored unused fuse information as the unused fuse information FS<0:K> in response to the row select signal ROW_SEL and the first to third column select signals COL_SEL, COL_UPSEL and COL_DNSEL which are generated by combining the row/column select signal ROWCOL_SEL, the up mat signal TECFUPREG and the down mat signal TECFDNREG (see FIG. 7). The fuse set latch unit 430 may output the selected mat address SMAT<0:3> by selecting one of the mat address MAT<0:3>, the up mat address UPMAT<0:3> and the down mat address DNMAT<0:3> according to the first to third column select signals COL_SEL, COL_UPSEL and COL_DNSEL. The fuse set latch unit 430 may generate the overflow signal OVERFLOW when it is determined from the fuse information RF_EN, RF_DIS, CF_EN and CF_DIS that the unused fuse information FS<0:K> does not exist.

Figure 6:
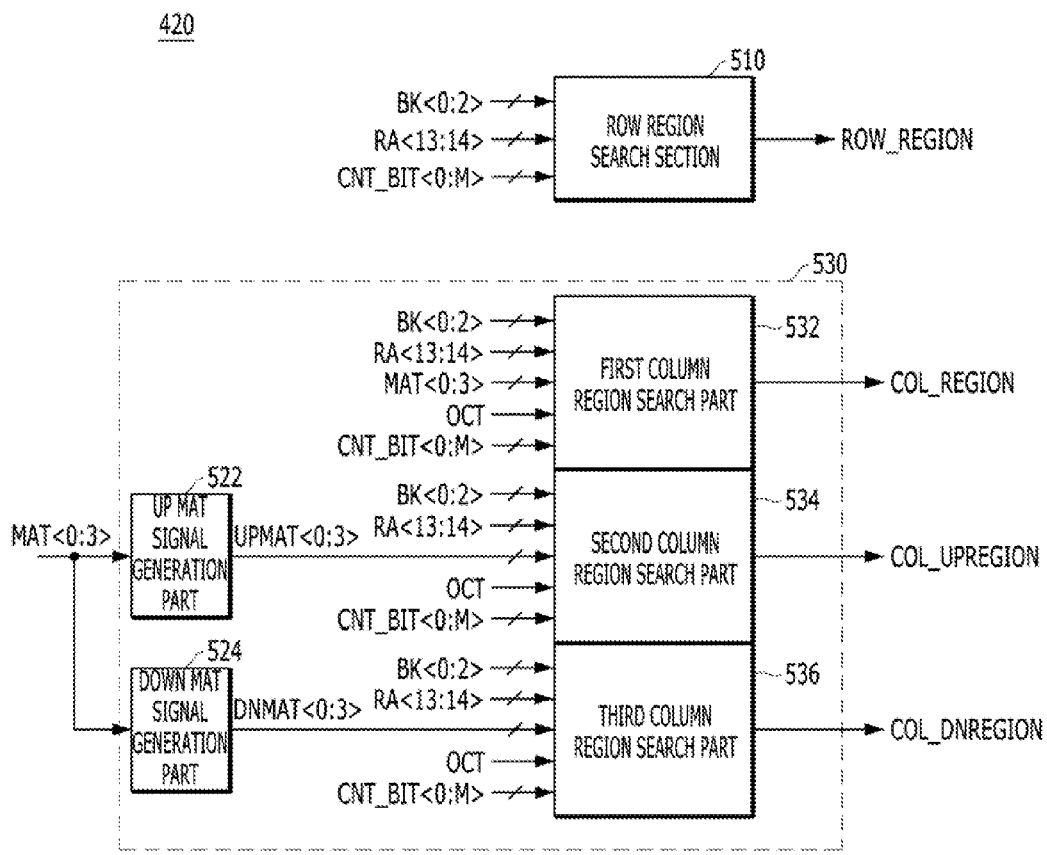
FIG. 6 is a block diagram illustrating an example configuration of a fail region search unit employed in the boot up control block of FIG. 5.

FIG. 6 is a detailed block diagram illustrating an example configuration for the fall region search unit 420 shown in FIG. 5.

Referring to FIG. 6, the fail region search unit 420 may include a row region search section 510 and a column region search section 530.

The row region search section 510 may search the row fuse region 210 corresponding to the bank address BK<0:2> and the mat group signal RA<13:14> of the fail address and output the row region signal ROW_REGION, in response to the counting signal CNT_BIT<0:M>.

The column region search section 530 may search the column fuse region 220 corresponding to the bank address BK<0:2>, the mat address MAT<0:3>, the mat region signal OCT and the mat group signal RA<13:14> of the fail address and output the first to third column region signals COL_REGION, COL_UPREGION and COL_DNREGION, in response to the counting signal CNT_BIT<0:M>.

The column region search section 530 may include an up mat signal generation part 522, a down mat signal generation part 524, a first column region search part 532, a second column region search part 534, and a third column region search part 536.

The up mat signal generation part 522 may up-count the mat address MAT<0:3> and generate the up mat address UPMAT<0:3>. The down mat signal generation part 524 may down-count the mat address MAT<0:3> and generate the down mat address DNMAT<0:3>. The up mat signal generation part 522 may be implemented by an adder, and the down mat signal generation part 524 may be implemented by a subtractor.

The first column region search part 532 may search the column fuse region 220 corresponding to the bank address BK<0:2>, the mat address MAT<0:3>, the mat region signal OCT and the mat group signal RA<13:14> and output the first column region signal COL_REGION, in response to the counting signal CNT_BIT<0:M>. The second column region search part 534 may search the column fuse region 220 corresponding to the bank address BK<0:2>, the up mat address UPMAT<0:3>, the mat region signal OCT and the mat group signal RA<13:14> and output the second column region signal COL_UPREGION, in response to the counting signal CNT_BIT<0:M>. The third column region search part 536 may search the column fuse region 220 corresponding to the bank address BK<0:2>, the down mat address DNMAT<0:3>, the mat region signal OCT and the mat group signal RA<13:14> and output the third column region signal COL_DNREGION, in response to the counting signal CNT_BIT<0:M>.

FIG. 7 is a detailed block diagram illustrating an example configuration for the fuse set latch unit 430 shown in FIG. 5.

Referring to FIG. 7, the fuse set latch unit 430 may include an input control section 610, an output control section 620, a row latch section 632, and first to third column latch sections 634, 636 and 638.

The input control section 610 may generate a row input control signal ROWLATP based on the row region signal ROW_REGION and the fuse information RF_EN, RF_DIS, CF_EN and CF_DIS. Also, the input control section 610 may generate first to third column input control signals COLLATP, COLUPLATP and COLDNLATP based on the first to third column region signals COL_REGION, COL_UPREGION and COL_DNREGION and the fuse information RF_EN, RF_DIS, CF_EN and CF_DIS.

The input control section 610 may include a row pulse generation part 612, a column pulse generation part 614, a row input control signal generation part 622, and first to third column input control signal generation parts 624, 626 and 628.

The row pulse generation part 612 may generate a row pulse signal ROWFSMRDLATP by synchronizing the first Information RF_EN and the second information RF_DIS among the fuse information RF_EN, RF_DIS, CF_EN and CF_DIS with the boot-up clock signal ATBOOTUP_CLK. The column pulse generation part 614 may generate a column pulse signal COLFSMRDLATP by synchronizing the third Information CF_EN and the fourth information CF_DIS among the fuse informations RF_EN, RF_DIS, CF_EN and CF_DIS with the boot-up clock signal ATBOOTUP_CLK. The row pulse generation part 612 and the column pulse generation part 614 may control a corresponding row or column pulse signal to be enabled, only in the case where an already used row/column fuse set and an unusable row/column fuse set are excluded.

The row input control signal generation part 622 may receive the row pulse signal ROWFSMRDLATP and the row region signal ROW_REGION, and generate the row input control signal ROWLATP. The respective first to third column input control signal generation parts 624, 626 and 628 may receive the column pulse signal COLFSMRDLATP and the first to third column region signals COL_REGION, COL_UPREGION and COL_DNREGION respectively corresponding thereto, and generate the first to third column input control signals COLLATP, COLUPLATP and COLDNLATP. Each of the row input control signal generation part 622 and the first to third column input control signal generation parts 624, 626 and 628 may be implemented by an AND gate which enables an output signal when all input signals are enabled.

The output control section 620 may generate the row select signal ROW_SEL and the first to third column select signals COL_SEL, COL_UPSEL and COL_DNSEL by combining the row/column select signal ROWCOL_SEL, the up mat signal TECFUPREG and the down mat signal TECFDNREG. For example, the output control section 620 may enable and output the row select signal ROW_SEL, when the row/column select signal ROWCOL_SEL with the low level indicating row repair is inputted and both the up mat signal TECFUPREG and the down mat signal TECFDNREG are inputted at low levels. Conversely, the output control section 620 may enable and output the first column select signal COL_SEL, when the row/column select signal ROWCOL_SEL with the high level indicating column repair is inputted and both the up mat signal TECFUPREG and the down mat signal TECFDNREG are inputted at the low levels. Otherwise, the output control section 620 may enable and output the second column select signal COL_UPSEL, when the row/column select signal ROWCOL_SEL with the high level indicating column repair is inputted, the up mat signal TECFUPREG is inputted at a high level and the down mat signal TECFDNREG is inputted at the low level.

The row latch section 632 may store a first bit group CNT_BIT<A:B> of the counting signal CNT_BIT<0:M> as unused row fuse information in response to the row input control signal ROWLATP, and output the stored unused row fuse information as unused row fuse information ROWFS<0:K> in response to the row select signal ROW_SEL. The first column latch section 634 may store a second bit group CNT_BIT<C:D> of the counting signal CNT_BIT<0:M> as unused column fuse information in response to the first column input control signal COLLATP, and output the stored unused column fuse information as an unused column fuse information COLFS<0:J> in response to the first column select signal COL_SEL. The second column latch section 636 may store the second bit group CNT_BIT<C:D> of the counting signal CNT_BIT<0:M> as unused column fuse information in response to the second column input control signal COLUPLATP, and output the stored unused column fuse information as unused column fuse information COLUPFS<0:3> in response to the second column select signal COL_UPSEL. The third column latch section 638 may store the second bit group CNT_BIT<C:D> of the counting signal CNT_BIT<0:M> as unused column fuse information in response to the third column input control signal COLDNLATP, and output the stored unused column fuse information as unused column fuse information COLDNFS<0:3> in response to the third column select signal COL_DNSEL. While not shown in the drawing, the row latch section 632 and the first to third column latch sections 634, 636 and 638 may be re in response to a re signal RSTB which is inputted from an exterior.

The fuse set latch unit 430 may further include a latch output section 650 which latches the unused row fuse information ROWFS<0:K>, the unused column fuse information COLFS<0:J>, the unused column fuse information COLUPFS<0:J> or the unused column fuse information COLDNFS<0:J> outputted from the row latch section 632 and the first to third column latch sections 634, 636 and 638 and outputs finally the unused fuse information FS<0:K>.

Also, the fuse set latch unit 430 may further include an overflow signal generation section 660 and a mat signal generation section 670.

The overflow signal generation section 660 may generate the overflow signal OVERFLOW by selecting the row input control signal ROWLATP when the row select signal ROW_SEL is enabled and selecting the first column input control signal COLLATP when the first column select signal COL_SEL is enabled. The overflow signal OVERFLOW may be enabled when unused row fuse information does not exist in the case of row repair and unused column fuse information does not exist in the case of column repair, that is, when the unused fuse information FS<0:K> does not exist. The mat signal generation section 670 may generate the selected mat address SMAT<0:3> by selecting one of the mat address MAT<0:3>, the up mat address UPMAT<0:3> and the down mat address DNMAT<0:3> based on the second column select signal COL_UPSEL and the third column select signal COL_DNSEL.

Hereinafter, the operation of the semiconductor memory device in accordance with an embodiment will be described with reference to FIGS. 1 to 7.

Figure 8A:
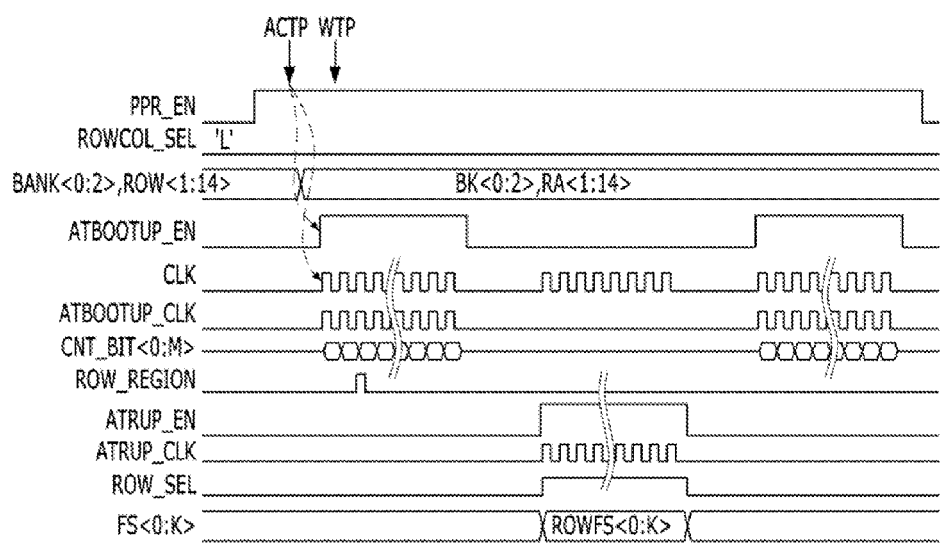
FIG. 8A is a timing diagram illustrating a row repair operation of a semiconductor memory device in accordance with an embodiment of the present invention.
Figure 8B:
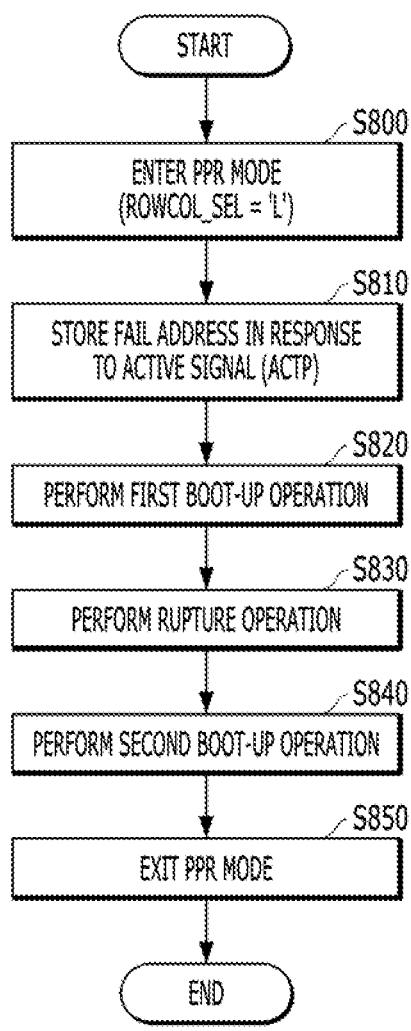
FIG. 8B is a flow chart of a row repair operation of a semiconductor memory device in accordance with an embodiment of the present invention.

FIGS. 8A and 8B are a timing diagram and a flow chart illustrating a row repair operation of a semiconductor memory device in accordance with an embodiment of the present invention, respectively.

Referring to FIGS. 8A and 8B, the PPR mode is entered when the PPR mode signal PPR_EN is enabled. According to the row/column select signal ROWCOL_SEL with the low level indicating row repair, row repair is performed (S800).

1) Step of Storing a Fall Address (S810)

At step S810, the row repair PPR includes storing a fail address in response to active signal ACTP. In more detail, the address latch block 110 of FIG. 2 may store the row address information ROW<1:14> and the bank information BANK<0:2> as the row address RA<1:14> and the bank address BK<0:2>, respectively, in response to the active signal ACTP.

2) Step of Performing a First Boot-Up Operation (S820)

At step S820 the row repair PPR further includes performing a first boot-up operation. More specifically, the control signal generation block 120 may enable the internal boot-up signal ATBOOTUP_EN in response to the active signal ACTP, and accordingly, the clock generation block 160 may generate the clock signal CLK. Thereafter, the control signal generation block 120 may receive the clock signal CLK, and generate the boot-up clock signal ATBOOTUP_CLK which toggles during the enable period of the internal boot-up signal ATBOOTUP_EN.

The counter 410 of the boot-up control block 130 in FIG. 5 may count the boot-up clock signal ATBOOTUP_CLK and generate the counting signal CNT_BIT<0:M> when the internal boot-up signal ATBOOTUP_EN is enabled. The fail region search unit 420 may search the row fuse region 210 corresponding to the bank address BK<0:2> and the mat group signal RA<13:14> of the fail address and output the row region signal ROW_REGION, in response to the counting signal CNT_BIT<0:M>.

At this time, the fuse array circuit 200 of FIG. 1 may output the fuse information RF_EN, RF_DIS, CF_EN and CF_DIS of a row fuse set and a column fuse set and output programmed row address and column address as the row fail data FS_RDATA<0:P> and the column fail data FS_CDATA<0:Q>, in a boot-up operation.

The input control section 610 of the fuse set latch unit 430 in FIG. 7 may enable the row input control signal ROWLATP in response to the row region signal ROW_REGION and the first information RF_EN and the second information RF_DIS of the fuse information RF_EN, RF_DIS, CF_EN and CF_DIS. Then, the row latch section 632 may complete the boot-up operation by storing the first bit group CNT_BIT<A:B> of the counting signal CNT_BIT<0:M> as unused row fuse information in response to the row input control signal ROWLATP.

3) Step of Performing a Rupture Operation (S830)

At step S830, the row repair PPR includes performing a rupture operation. As both the up mat signal TECFUPREG and the down mat signal TECFDNREG are inputted at the low levels, the output control section 620 of FIG. 7 may enable the row select signal ROW_SEL, and in response to this, the row latch section 632 may output the stored unused row fuse information as the unused row fuse information ROWFS<0:K>. The latch output section 650 may latch the unused row fuse information ROWFS<0:K> and finally output the unused fuse information FS<0:K>. Meanwhile, the overflow signal generation section 660 may generate the overflow signal OVERFLOW by selecting the row input control signal ROWLATP, when the row select signal ROW_SEL is enabled. In the case where the unused fuse information FS<0:K> exists as both the row select signal ROW_SEL and the row input control signal ROWLATP are enabled, the overflow signal generation section 660 may disable and output the overflow signal OVERFLOW.

The repair data selection block 150 of FIG. 2 may generate the repair address SADDR<0:N> corresponding to a row address of the fail address, output the bank address BK<0:2> as the selected bank address SBANK<0:2>, and output the unused fuse information FS<0:K> as the unused fuse information FUSE_<0:K>.

The control signal generation block 120 of FIG. 2 may enable the internal rupture signal ATRUP_EN, and generate the rupture clock signal ATRUP_CLK which toggles during the enable period of the internal rupture signal ATRUP_EN.

The rupture control block 140 of FIG. 2 may generate the rupture control signal RUP_CTRL<0:S> in response to the internal rupture signal ATRUP_EN and the rupture clock signal ATRUP_CLK. At this time, if the overflow signal OVERFLOW which notifies that the unused fuse information FS<0:K> does not exist is enabled, the rupture control block 140 may disable and output the rupture control signal RUP_CTRL<0:S> such that a rupture operation is not performed.

The fuse array circuit 200 of FIG. 1 may perform a rupture operation in response to the rupture control signal RUP_CTRL<0:5> such that the repair address SADDR<0:N> is programmed in an unused fuse set corresponding to the unused fuse information FUSE_<0:K>.

4) Step of Performing a Second Boot-Up Operation (S840)

At step S840, the row repair PPR further includes performing a second boot-up operation S840. More specifically, the control signal generation block 120 of FIG. 2 may enable again the internal boot-up signal ATBOOTUP_EN, and generate the boot-up clock signal ATBOOTUP_CLK which toggles during the enable period of the internal boot-up signal ATBOOTUP_EN.

The fuse array circuit 200 of FIG. 1 may output again programmed row address and column address as the row fail data FS_RDATA<0:P> and the column fail data FS_CDATA<0:Q>, respectively, in a boot-up operation. According to this fact, the row/column redundancy circuit 300 may update the row fail data FS_RDATA<0:P> and the column fail data FS_CDATA<0:Q> outputted from the fuse array circuit 200, and perform row repair or column repair based on updated data.

Meanwhile, the fuse array circuit 200 of FIG. 1 may output again the fuse information RF_EN, RF_DIS, CF_EN and CF_DIS of a row fuse set and a column fuse set in the boot-up operation, and the respective components of the fuse array control circuit 100 may perform again the first boot-up operation and update unused row fuse information in the row latch section 632 of FIG. 7. In another embodiment of the present disclosure, by applying a mode register (MRS) command, updated unused fuse information may be read out through a data input/output (DQ) pad, and a post package repair (PPR) fuse resource may be checked.

After the above-described operations are performed, the PPR mode may be exited as the PPR mode signal PPR_EN is disabled (S850).

Figure 9A:
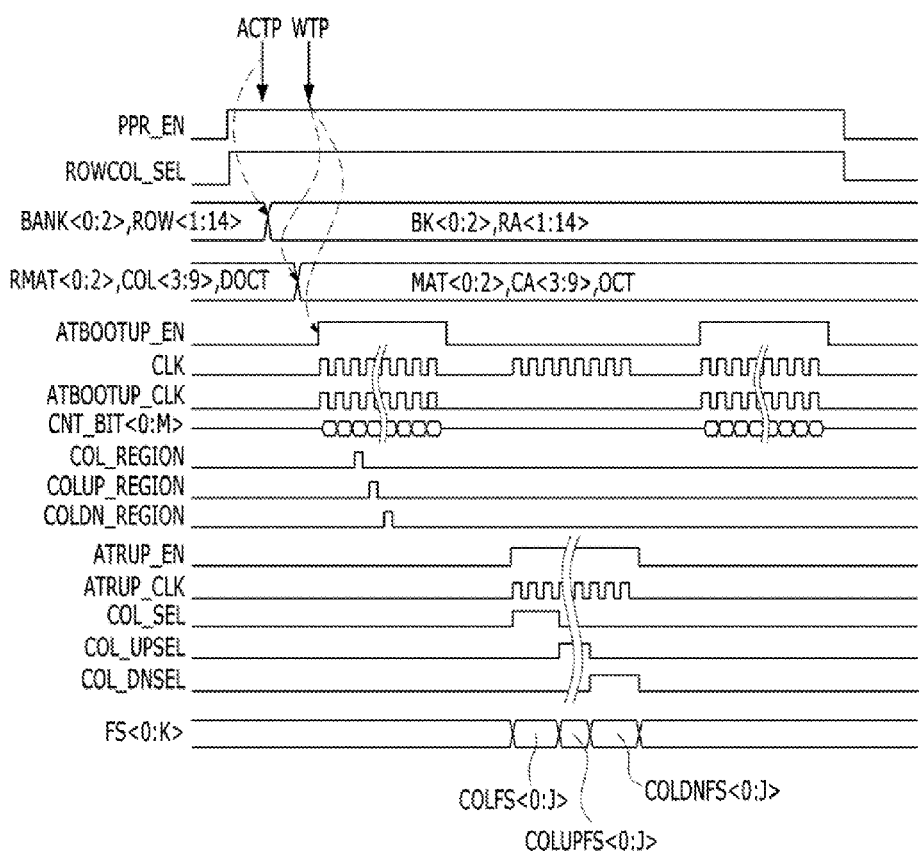
FIG. 9A is a timing diagram illustrating a column repair operation of a semiconductor memory device in accordance with an embodiment of the present invention.
Figure 9B:
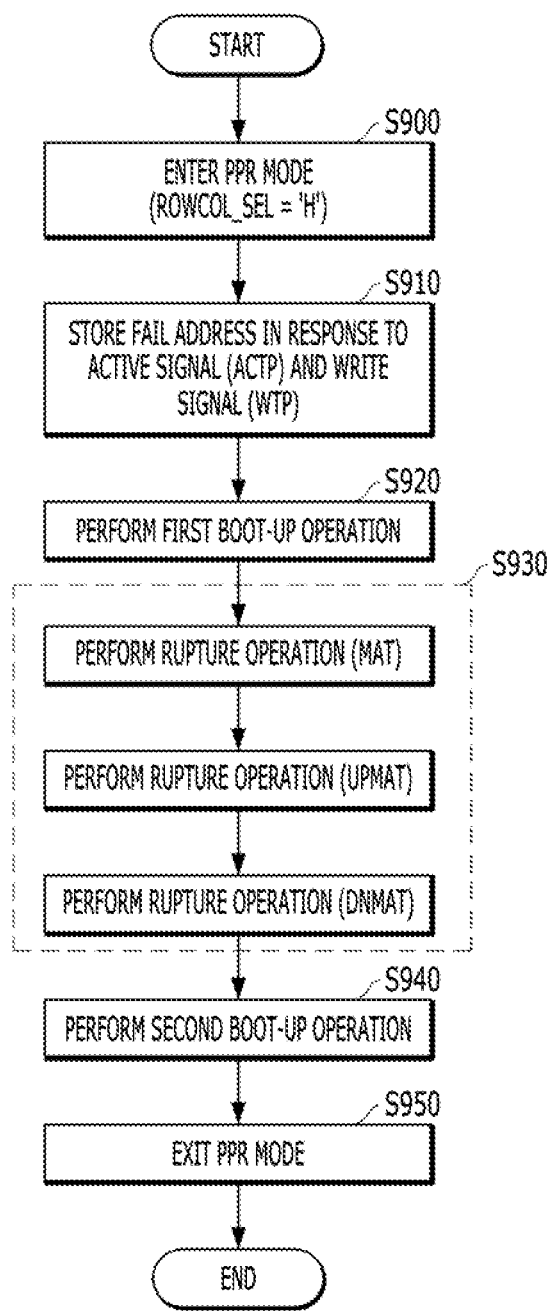
FIG. 9B is a flow chart of a column repair operation of a semiconductor memory device in accordance with an embodiment of the present invention.

FIGS. 9A and 9B are a timing diagram and a flow chart illustrating a column repair operation of a semiconductor memory device in accordance with an embodiment of the present invention, respectively.

Referring to FIGS. 9A and 9B, the PPR mode is entered as the PPR mode signal PPR_EN is enabled. According to the row/column select signal ROWCOL_SEL with the high level indicating column repair, column repair is performed (S900).

1) Step of Storing a Fail Address (S910)

At step S910, the column repair PPR stores a fall address in response to active signal ACTP. More specifically, the address latch block 110 of FIG. 2 may store the row address information ROW<1:14> and the bank information BANK<0:2> as the row address RA<1:14> and the bank address BK<0:2>, respectively, in response to the active signal ACTP. Also, the address latch block 110 may store the column address information COL<3:9>, the mat information RMAT<0:3> and the mat region information DOCT as the column address CA<3:9>, the mat address MAT<0:3> and the mat region signal OCT, respectively, in response to the write signal WTP.

2) Step of Performing a First Boot-Up Operation (S920)

At step 920, the column repair PPR includes performing a first boot-up operation. More specifically, the control signal generation block 120 of FIG. 2 may enable the internal boot-up signal ATBOOTUP_EN in response to the write signal WTP, and accordingly, the clock generation block 160 may generate the clock signal CLK. Thereafter, the control signal generation block 120 may receive the clock signal CLK, and generate the boot-up clock signal ATBOOTUP_CLK which toggles during the enable period of the internal boot-up signal ATBOOTUP_EN.

The counter 410 of the boot-up control block 130 in FIG. 5 may count the boot-up clock signal ATBOOTUP_CLK and generate the counting signal CNT_BIT<0:M> when the internal boot-up signal ATBOOTUP_EN is enabled. The fail region search unit 420 may receive the mat address MAT<0:3> and generate the up mat address UPMAT<0:3> and the down mat address DNMAT<0:3>. The fail region search unit 420 may search the column fuse region 220 corresponding to the fall address and the respective mat addresses, in response to the counting signal CNT_BIT<0:M>, and output the first to third column region signals COL_REGION, COL_UPREGION and COL_DNREGION. That is to say, the fail region search unit 420 may output all the first to third column region signals COL_REGION, COL_UPREGION and COL_DNREGION to perform repair also in corresponding columns of an up mat and a down mat which share a bit line sense amplifier (BLSA) with a mat where a fail cell is positioned.

At this time, the fuse array circuit 200 of FIG. 1 may output the fuse information RF_EN, RF_DIS, CF_EN and CF_DIS of a row fuse set and a column fuse set and output programmed row address and column address as the row fall data FS_RDATA<0:P> and the column fall data FS_CDATA<0:Q>, in a boot-up operation.

The input control section 610 of the fuse set latch unit 430 in FIG. 7 may enable the first to third column input control signals COLLATP, COLUPLATP and COLDNLATP in response to the first to third column region signals COL_REGION, COL_UPREGION and COL_DNREGION and the third information CF_EN and the fourth information CF_DIS of the fuse information RF_EN, RF_DIS, CF_EN and CF_DIS. Then, the first to third column latch sections 634, 636 and 638 may complete the boot-up operation by storing the second bit group CNT_BIT<C:D> of the counting signal CNT_BIT<0:M> as unused column fuse information in response to the first to third column input control signals COLLATP, COLUPLATP and COLDNLATP.

3) Step of Performing a Rupture Operation (S930)

At step S930, a rupture operation is performed. First, as both the up mat signal TECFUPREG and the down mat signal TECFDNREG are inputted at the low levels, the output control section 620 of FIG. 7 may enable the first column select signal COL_SEL, and in response to this, the first column latch section 634 may output the stored unused column fuse information as the unused column fuse information COLFS<0:3>. The latch output section 650 may latch the unused column fuse information COLFS<0:J> and finally output the unused fuse information FS<0:K>. The repair data selection block 150 of FIG. 2 may generate the repair address SADDR<0:N> corresponding to a column address of the fail address, output the bank address BK<0:2> as the selected bank address SBANK<0:2>, and output the unused fuse information FS<0:K> as the unused fuse information FUSE_<0:K>.

The control signal generation block 120 of FIG. 2 may enable the internal rupture signal ATRUP_EN, and generate the rupture clock signal ATRUP_CLK which toggles during the enable period of the internal rupture signal ATRUP_EN. The rupture control block 140 may generate the rupture control signal RUP_CTRL<0:S> in response to the internal rupture signal ATRUP_EN and the rupture clock signal ATRUP_CLK. The fuse array circuit 200 of FIG. 1 may perform a rupture operation in response to the rupture control signal RUP_CTRL<0:S> such that the repair address SADDR<0:N> is programmed in an unused fuse set corresponding to the unused fuse information FUSE_<0:K>.

Next, as the up mat signal TECFUPREG is inputted at the high level and the down mat signal TECFDNREG is inputted at the low level, the output control section 620 of FIG. 7 may enable the second column select signal COL_UPSEL, and in response to this, the second column latch section 636 may output the stored unused column fuse information as the unused column fuse information COLUPFS<0:3>. Similarly, by repeating the above-described operations, the fuse array circuit 200 of FIG. 1 may perform a rupture operation in response to the rupture control signal RUP_CTRL<0:S> such that the repair address SADDR<0:N> is programmed in an unused fuse set corresponding to the unused fuse information FUSE_<0:K>.

Last, as the up mat signal TECFUPREG is inputted at the low level and the down mat signal TECFDNREG is inputted at the high level, the output control section 620 of FIG. 7 may enable the third column select signal COL_DNSEL, and in response to this, the third column latch section 638 may output the stored unused column fuse information as the unused column fuse information COLDNFS<0:3>. Similarly, by repeating the above-described operations, the fuse array circuit 200 of FIG. 1 may perform a rupture operation in response to the rupture control signal RUP_CTRL<0:S> such that the repair address SADDR<0:N> is programmed in an unused fuse set corresponding to the unused fuse information FUSE_<0:K>.

Through the above procedure, in the case of column repair, it is possible to control repair to be performed also in corresponding columns of an up mat and a down mat which share a bit line sense amplifier (BLSA) with a mat where the fail cell is positioned.

4) Step of Performing a Second Boot-Up Operation (S940)

Thereafter, a second boot-up operation is performed at step S940. More specifically, the control signal generation block 120 of FIG. 2 may enable again the internal boot-up signal ATBOOTUP_EN, and generate the boot-up clock signal ATBOOTUP_CLK which toggles during the enable period of the internal boot-up signal ATBOOTUP_EN.

The fuse array circuit 200 of FIG. 1 may output again programmed row address and column address as the row fail data FS_RDATA<0:P> and the column fall data FS_CDATA<0:Q>, respectively, in a boot-up operation. According to this fact, the row/column redundancy circuit 300 of FIG. 1 may update the row fail data FS_RDATA<0:P> and the column fail data FS_CDATA<0:Q> outputted from the fuse array circuit 200, and perform row repair or column repair based on updated data.

The fuse array circuit 200 may output again the fuse information RF_EN, RF_DIS, CF_EN and CF_DIS of a row fuse set and a column fuse set in the boot-up operation, and the respective components of the fuse array control circuit 100 may perform again the first boot-up operation and update unused row fuse information in the row latch section 632. In another embodiment of the present disclosure, by applying a mode register (MRS) command, an updated unused fuse information may be read out through a data input/output (DQ) pad, and a post package repair (PPR) fuse resource may be checked.

After the above-described operations are performed, the PPR mode may be exited as the PPR mode signal PPR_EN is disabled (950).

As is apparent from the above descriptions, a semiconductor memory device is provided, in accordance with an embodiment that is capable of performing a row repair post package repair and a column repair post package repair depending on whether a row fail or a column fail is detected. As a result, the yield of a semiconductor package employing the semiconductor memory device may be significantly improved.

Although various embodiments have been described for illustrative purposes, it will be apparent to those skilled in the art that various changes and modifications may be made without departing from the spirit and scope of the Invention as defined in the following claims.

For instance, positions and kinds of the logic gates and transistors described as an example in the above embodiment should be differently realized according to the polarities of the signals inputted thereto.

What is claimed is:

1. A semiconductor memory device comprising:
a fuse array circuit including a row fuse region which includes a plurality of row fuse sets each for programming a row address of a fail cell and a column fuse region which includes a plurality of column fuse sets each for programming a column address of a fall cell, the fuse array circuit being suitable for outputting fuse information from the row fuse sets and from the column fuse sets and outputting programmed a row address as a row fail data and a column address as a column fail data, during a boot-up operation;
a fuse array control circuit suitable for storing a fail address based on fail cell information during a repair operation, searching unused fuse sets from the row fuse region and the column fuse region based on the fuse information during the boot-up operation, and controlling the fail address to be programmed in the unused fuse sets during a rupture operation; and
a row and column redundancy circuit suitable for performing a row redundancy or column redundancy operation in correspondence to the row fail data and the column fail data.

2. The semiconductor memory device according to claim 1, wherein the fuse information include information on whether a corresponding row fuse set is already used and information on whether the corresponding row fuse set is impossible to use, and include information on whether a corresponding column fuse set is already used and Information on whether the corresponding column fuse set is impossible to use.

3. The semiconductor memory device according to claim 1, wherein the fuse array control circuit stores the searched unused fuse sets as unused row fuse information of the row fuse region and unused column fuse information of the column fuse region during the boot-up operation, and selects and outputs one of the unused row fuse information and the unused column fuse information according to a row and column select signal during the rupture operation.

4. The semiconductor memory device according to claim 1, wherein the fuse array control circuit controls the rupture operation not to be performed, when unused fuse sets of the row fuse region and the column fuse region searched based on the fuse information do not exist.

5. The semiconductor memory device according to claim 1, wherein the fuse array control circuit comprises:
an address latch block suitable for storing the fail address including a row address, a column address, a bank address and mat information of a fail cell in response to an active signal and a write signal, during the repair operation;

a control signal generation block suitable for sequentially generating a boot-up signal and a rupture signal in response to the active signal and the write signal during the repair operation;

a boot-up control block suitable for searching the row fuse region and the column fuse region corresponding to the fail address in response to the boot-up signal, storing unused fuse information of the searched row fuse region and column fuse region, and outputting unused fuse information corresponding to a row and column select signal;

a repair data selection block suitable for receiving the fail address and generating a repair address corresponding to the row and column select signal; and a rupture control block suitable for controlling the repair address to be programmed in a row fuse set or a column fuse set corresponding to the unused fuse information, in response to the rupture signal.

6. The semiconductor memory device according to claim 5, wherein the address latch circuit stores the bank address and the row address in response to the active signal and stores the column address and the mat information in response to the write signal, during the repair operation.

7. The semiconductor memory device according to claim 5,
wherein the boot-up control block outputs an overflow signal when the unused fuse information of the row fuse region and the column fuse region searched based on the fuse information do not exist, and
wherein the rupture control block disables and outputs the rupture control signal in response to the overflow signal.

8. The semiconductor memory device according to claim 5, wherein the fuse array control circuit further comprises:
a clock generation block suitable for generating a clock signal which toggles, when the boot-up signal or the rupture signal is enabled.

9. The semiconductor memory device according to claim 8, wherein the control signal generation block comprises:
a mode clock signal generation unit suitable for receiving the clock signal, and generating a boot-up clock signal which toggles during an enable period of the boot-up signal and a rupture clock signal which toggles during an enable period of the rupture signal;
a boot-up control signal generation unit suitable for generating the boot-up signal which is enabled in response to the active signal, the write signal or a rupture stop signal and is disabled in response to a boot-up stop signal and generating the boot-up stop signal after the boot-up clock signal toggles for a predetermined period, during the repair operation; and
a rupture control signal generation unit suitable for generating the rupture signal which is enabled in response to the boot-up stop signal and is disabled in response to the rupture stop signal and generating the rupture stop signal after the rupture clock signal toggles for a predetermined period.

10. The semiconductor memory device according to claim 8, wherein the boot-up control block comprises:
a counter suitable for counting the clock signal and generating a counting signal, when the boot-up signal is enabled;
a fall region search unit suitable for searching the row fuse region and the column fuse region corresponding to the fail address and generating a row region signal and a plurality of column region signals, in response to the counting signal; and
a fuse set latch unit suitable for storing the counting signal as the unused fuse information based on the row region signal, the plurality of column region signals and the fuse information, and outputting the stored unused fuse information in response to an up and down mat signal and the row and column select signal.

11. The semiconductor memory device according to claim 10, wherein the fail region search unit comprises:
a row region search section suitable for searching the row fuse region corresponding to the fail address and outputting the row region signal, in response to the counting signal; and
a column region search section suitable for searching the column fuse region corresponding to the fall address and outputting the plurality of column region signals, in response to the counting signal.

12. The semiconductor memory device according to claim 11, wherein the column region search section comprises:
an up mat signal generation part suitable for up-counting the mat information of the fail address and generating up mat information;
a down mat signal generation part suitable for down-counting the mat information of the fall address and generating down mat information;
a first column region search part suitable for searching the column fuse region corresponding to the bank address and the mat information of the fall address and outputting a first column region signal, in response to the counting signal;
a second column region search part suitable for searching the column fuse region corresponding to the bank address and the up mat information and outputting a second column region signal, in response to the counting signal; and
a third column region search part suitable for searching the column fuse region corresponding to the bank address and the down mat information and outputting a third column region signal, in response to the counting signal.

13. The semiconductor memory device according to claim 10, wherein the fuse set latch unit comprises:
an input control section suitable for generating a row input control signal based on the row region signal and the fuse information, and generating a plurality of column input control signals based on the plurality of column region signals and the fuse information;
an output control section suitable for combining the up and down mat signal and the row and column select signal, and generating a row select signal and a plurality of column select signals;
a row latch section suitable for storing a first bit group of the counting signal as unused row fuse information in response to the row input control signal, and outputting the stored unused row fuse information in response to the row select signal; and
a plurality of column latch sections suitable for storing a second 20 bit group of the counting signal as unused column fuse information in response to the plurality of column input control signals, and outputting the stored unused column fuse information in response to the plurality of column select signals.

14. The semiconductor memory device according to claim 13, wherein the input control section comprises:

a row pulse generation part suitable for receiving row fuse information among the fuse information, and generating a row pulse signal;

a column pulse generation part suitable for receiving column fuse information among the fuse information, and generating a column pulse signal;

a first input control signal generation part suitable for generating the row input control signal in response to the row pulse signal and the row region signal; and a second input control signal generation part suitable for generating the plurality of column input control signals in response to the column pulse signal and the plurality of column region signals.

15. The semiconductor memory device according to claim 13, wherein the fuse set latch unit further comprises:

an overflow signal generation section suitable for generating the overflow signal by selecting the row input control signal in response to the row select signal and selecting a first column input control signal in response to a first column select signal; and a mat signal generation section suitable for generating a selected mat address by selecting one of the mat information, the up mat information and the down mat information based on second and third column select signals.

16. A semiconductor memory device comprising:

a fuse array circuit including a row fuse region which includes a plurality of row fuse sets, each for programming a row address of a fail cell, and a column fuse region which includes a plurality of column fuse sets, each for programming a column address of the fall cell;

an address latch block suitable for storing a fail address including a row address, a column address, a bank address and mat information in response to a repair mode signal;

a control signal generation block suitable for generating a boot-up signal and a rupture signal in response to an active signal and a write signal, in response to the repair mode signal;

a fail region search unit suitable for searching the row fuse region and the column fuse region corresponding to the fail address and generating a row region signal and a plurality of column region signals, in response to a counting signal which is generated by counting a clock signal, when the boot-up signal is enabled;

a fuse set latch unit suitable for storing unused row fuse information and unused column fuse information based on the row region signal, the plurality of column region signals and fuse information outputted from the fuse array circuit, and selectively outputting the stored unused row or column fuse information in response to an up and down mat signal and a row and column select signal; and a rupture control block suitable for controlling the fail address to be programmed in a row fuse set or a column fuse set corresponding to the unused row or column fuse information, in response to the rupture signal.

17. The semiconductor memory device according to claim 16, wherein the repair mode signal is outputted from a mode register (MRS) in a post package repair mode.

18. The semiconductor memory device according to claim 16, wherein the fuse set latch unit outputs an overflow signal when the unused row fuse information or the unused column fuse information does not exist, and wherein the rupture control block disables and outputs the rupture control signal in response to the overflow signal.

19. The semiconductor memory device according to claim 16, wherein the address latch block stores the bank address and the row address in response to the active signal and stores the column address and the mat information in response to the write signal, when the repair mode signal is enabled.

20. The semiconductor memory device according to claim 16, wherein the fail region search unit comprises:

a row region search section suitable for searching the row fuse region corresponding to the fall address and outputting the row region signal, in response to the counting signal;

an up mat signal generation part suitable for up-counting the mat information of the fail address and generating up mat information;

a down mat signal generation part suitable for down-counting the mat information of the fail address and generating down mat information;

a first column region search part suitable for searching the column fuse region corresponding to the bank address and the mat information of the fall address and outputting a first column region signal, in response to the counting signal;

a second column region search part suitable for searching the column fuse region corresponding to the bank address and the up mat information and outputting a second column region signal, in response to the counting signal; and a third column region search part suitable for searching the column fuse region corresponding to the bank address and the down mat information and outputting a third column region signal, in response to the counting signal.

21. The semiconductor memory device according to claim 16, wherein the fuse set latch unit comprises:

an input control section suitable for generating a row input control signal based on the row region signal and the fuse information, and generating a plurality of column input control signals based on the plurality of column region signals and the fuse information;

an output control section suitable for combining the up and down mat signal and the row and column select signal, and generating a row select signal and a plurality of column select signals;

a row latch section suitable for storing a first bit group of the counting signal as unused row fuse information in response to the row input control signal, and outputting the stored unused row fuse information in response to the row select signal; and a plurality of column latch sections suitable for storing a second bit group of the counting signal as unused column fuse information in response to the plurality of column input control signals, and outputting the stored unused column fuse information in response to the plurality of column select signals.

22. The semiconductor memory device according to claim 21, wherein the fuse set latch unit further comprises:

an overflow signal generation section suitable for generating the overflow signal by selecting the row input control signal in response to the row select signal and selecting a first column input control signal in response to a first column select signal; and a mat signal generation section suitable for generating a selected mat address by selecting one of the mat information, the up mat information and the down mat information based on second and third column select signals.

\* \* \* \* \*